United States Patent [19]
Zsolnay

[11] Patent Number: 5,196,989
[45] Date of Patent: Mar. 23, 1993

[54] RIGID CIRCUIT BOARD STRUCTURE USING IMPINGEMENT COOLING

[75] Inventor: Denes L. Zsolnay, Rolling Hills Estates, Calif.

[73] Assignee: TRW Inc., Redondo Beach, Calif.

[21] Appl. No.: 832,635

[22] Filed: Feb. 7, 1992

Related U.S. Application Data

[63] Continuation of Ser. No. 506,057, Apr. 9, 1990, abandoned.

[51] Int. Cl.$^5$ ............................................. H05K 7/20
[52] U.S. Cl. .................................. 361/383; 165/80.3; 165/908; 361/415
[58] Field of Search ............. 165/80.3, 104.33, 104.34, 165/908; 174/15.1, 16.1, 16.3; 62/418, 413, 419; 361/412, 415, 381–386; 211/41

[56] References Cited

U.S. PATENT DOCUMENTS

| | | | |
|---|---|---|---|
| 2,394,060 | 2/1946 | Holmes | 250/27.5 |
| 3,843,910 | 10/1974 | Ringuet | 317/100 |
| 4,148,534 | 4/1979 | Veburg | 361/384 |
| 4,277,816 | 7/1981 | Dunn et al. | 361/384 |
| 4,296,455 | 10/1981 | Leaycraft et al. | 361/383 |
| 4,399,484 | 9/1983 | Mayer | 361/382 |
| 4,494,171 | 1/1985 | Bland et al. | 361/386 |
| 4,498,118 | 2/1985 | Bell | 361/384 |
| 4,648,007 | 3/1987 | Garner | 361/384 |
| 4,674,004 | 6/1987 | Smith et al. | 361/384 |
| 4,851,965 | 7/1989 | Gabuzda et al. | 361/383 |

Primary Examiner—Gerald P. Tolin
Attorney, Agent, or Firm—Noel F. Heal; Robert W. Keller

[57] ABSTRACT

A circuit board construction including a circuit board with circuit modules installed on at least one face of the board, and at least one baffle plate connected rigidly to the board. The baffle plate is of approximately the same dimensions as the circuit board and is rigidly connected to it in a parallel, spaced-apart relationship. The baffle plate has openings at selected locations to direct air onto board-mounted circuit modules, and forms one face of an inlet air plenum, the other face of which is one surface of the circuit board to which the baffle plate is attached, or one face of an adjacent surface. The construction thereby provides impingement cooling of its components, and greatly improved structural rigidity of the circuit boards. One of the forms of the device illustrated has a single baffle plate associated with each circuit board, with circuit modules located on either the inner surface or the outer surface of the board. An alternative form of the invention includes a circuit board with circuit modules on both faces, and two baffle plates, one on each side of the circuit board, such that an intake air plenum is formed between each baffle plate and the surface of an adjacent circuit board or baffle plate.

3 Claims, 3 Drawing Sheets

RIGID CIRCUIT BOARD STRUCTURE USING IMPINGEMENT COOLING

This application is a continuation of U.S. patent application Ser. No. 07/506,057, filed Apr. 9, 1990, now abandoned.

BACKGROUND OF THE INVENTION

This invention relates generally to the construction of circuit boards on which large numbers of integrated circuits are mounted. As integrated circuits have become more complex, they have also grown in their need to dissipate power, in the form of heat. A parallel development in integrated circuits has been an increase in their speed of operation, as governed by clock signals distributed to the circuits. For faster clock speeds, the distances over which signals are transmitted become of more critical importance. In general, as the clock speed increases so does the need for spacing various circuits on the same circuit board more closely together. Thus two factors in the design of integrated circuits have combined to increase the power density on circuit boards. Higher circuit complexity results in higher power dissipation levels for each integrated circuit module; and the use of higher clock speeds requires that circuit modules must be more closely spaced on each circuit board.

Until recently, the usual technique for cooling electronic circuitry mounted on circuit boards was to merely blow air through the spaces between parallel, rack-mounted boards, from one end to the other. The difficulty with this approach is that there is inevitably a temperature gradient from one end of each circuit board to the other. For efficient cooling of the more powerful circuit modules, they must be positioned close to the cooler air at the inlet end of a rack of boards. Another problem caused by the presence of a temperature gradient is that, for certain types of circuit chips, such as emitter-coupled logic (ECL) circuitry, a temperature difference between chips degrades their ability to communicate.

One method of increasing the capacity for air cooling of circuit boards is known as impingement cooling. Basically, in an impingement cooling system the cooling medium, usually air, enters through a plenum that is in close proximity to one or more circuit boards. This inlet plenum is positioned between adjacent circuit boards and has openings in its walls to direct air onto selected circuit modules and components. The plenum openings can be of various sizes to ensure that just enough cool air impinges directly on each circuit to be cooled. After impingement on the circuit modules, the cooling air flows in a direction parallel to the boards, as in a conventional cooling arrangement.

There are a number of patents disclosing impingement cooling systems. For example, Bell, U.S. Pat. No. 4,498,118 discloses a structure in which a cooling plenum is mounted between two adjacent circuit boards, and has openings to permit cooling air to impinge directly on components mounted on the circuit boards. Similarly, U.S. Pat. Nos. 4,277,816 to Dunn et al. and 4,296,455 to Leaycraft et al. disclose a cooling system in which a separate air plenum has openings positioned to provide cooling flow to selected components on an adjacent circuit board, and each opening has a cylindrical sleeve mounted in it, to carry the air directly onto heat sinks of the components, which are appropriately spaced to permit spent air to have minimal effect on adjacent circuit modules.

Prior impingement cooling systems have used relatively large air plena located between adjacent circuit boards. This increases the overall volume required to house the circuit boards, and lengthens signal paths needed for board interconnections. Attempts to use the same cooling principles with thin air plena have resulted in high pressure losses, and require noisy, oversized blowers.

Another difficulty with larger circuit boards is that they tend to lack the degree of stiffness needed to facilitate handling during installation and removal. Various structural modifications have been proposed to increase board stiffness, the most common being the addition of stiffening bars fixed to each board. The major difficulty with these is that they interfere with the flow of cooling air, and they restrict component positioning.

Accordingly, there is still need for improvement in the construction of impingement air cooling systems for circuit boards. The present invention is directed to this end.

SUMMARY OF THE INVENTION

The present invention resides in an impingement cooling circuit board construction in which air plena are integrated with circuit boards. In its simplest form, the circuit board construction of the invention includes a circuit board on which components are mounted and a baffle plate of substantially the same size as the circuit board, the circuit board and the baffle plate being connected to form a single rigid structure. An air plenum is formed by one surface of the baffle plate and one surface of an adjacent circuit board construction, and the baffle plate has openings through which air flows into direct impingement with circuit modules mounted on the circuit board.

In one form of the invention, the baffle plate is mounted on the same side of the circuit board as the circuit modules. This not only protects the circuit modules during handling of the boards, but also allows easy visual inspection of correct registration of the holes in the baffle plate with respect to components on the board. Alternatively, the baffle plate is mounted on the opposite side of the circuit board, and an air plenum is formed between the circuit board and the baffle plate to which it is secured. This arrangement permits easy removal and servicing of circuit components on the board, but requires that the openings in the baffle plate be correctly registered with components on the adjacent circuit board. Consequently, in this embodiment of the invention the relative positions of circuit board constructions in a rack is of critical importance to the cooling system. Another possibility is to employ two baffles, mounted one on each side of a circuit board, which may be of either single-sided or double-sided design.

An important aspect of the circuit board construction of the invention is that the mechanical connection of each circuit board to at least one baffle plate results in an extremely rigid structure that requires no support between its ends, even for very long boards.

It will be appreciated from the foregoing that the present invention represents a significant advance in the field of circuit board design. In particular, the invention provides impingement cooling of board-mounted circuit components by means of an air space formed between a baffle plate and one face of the circuit board itself. Depending on the configuration of the circuit board, this air space serves either as an intake plenum or an exhaust plenum. Moreover, mechanical interconnection of the circuit board to at least one baffle plate results in greatly improved rigidity of the board structure. Other aspects and advantages of the invention will become apparent from the following more detailed description, taken in conjunction with the accompanying drawings.

DESCRIPTION OF THE PREFERRED EMBODIMENTS

Figure 1:
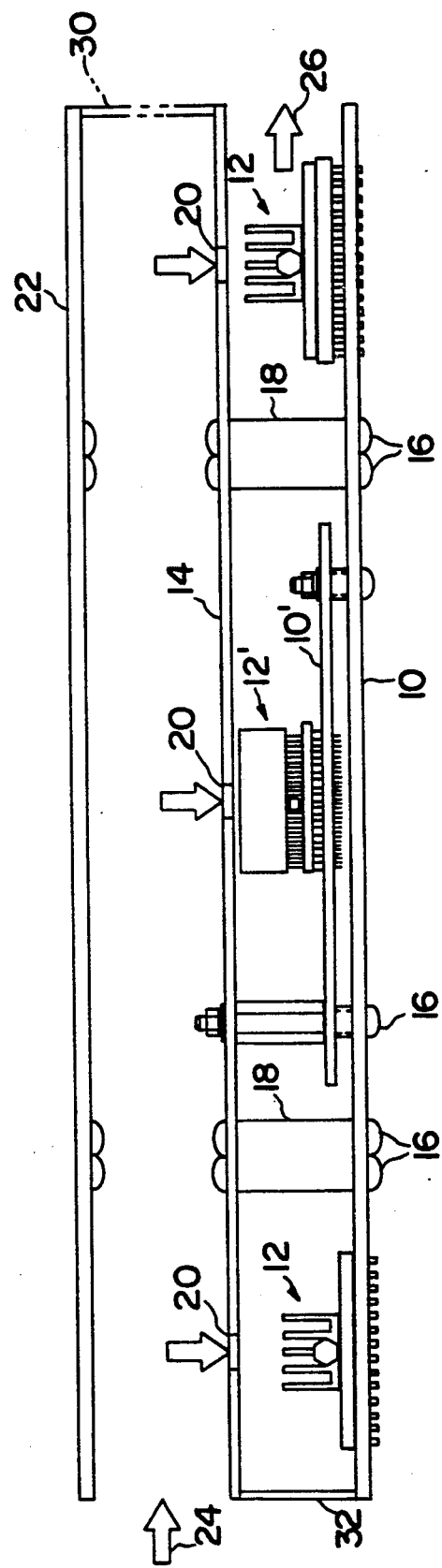
FIG. 1 is an elevational view of a circuit board construction in accordance with the invention, showing one circuit board and a baffle plate in combination, and a second adjacent circuit board.

As shown in the drawings for purposes of illustration, the present invention is principally concerned with improvements in impingement cooling systems and improved stiffening techniques for rack-mounted sets of circuit boards. As integrated circuits have become more complex and clock speeds faster, the power to be dissipated from large circuit boards containing integrated circuits has increased to the point where simple forced-air cooling systems are insufficient. Without direct impingement of cooling air on board-mounted components, temperature differences are present and some components may be "shadowed" by others positioned upstream in the air flow. Impingement cooling allows air to be directed onto selected circuit modules without first being heated by other components, and at a sufficient flow rate to achieve necessary cooling. The provision of between-board cooling plena for impingement cooling unfortunately increases the overall rack volume, and increases the path lengths of connections between boards.

In accordance with the present invention, each circuit board to be cooled has at least one baffle plate spaced apart from, but rigidly coupled to the circuit board. FIG. 1 shows by way of example a circuit board, indicated by reference numeral 10, on which are mounted a number of circuit modules 12. One of the modules, indicated at 12', is mounted on its own separate and much smaller board 10', which is in turn mounted onto the main board 10. A baffle plate 14 of the same length and width as the board 10 is connected to the board by means of a plurality of screws 16, which extend through the board and the baffle plate, and through spacers 18 for maintaining a uniform spacing between the board and baffle plate. The combined structure of the circuit board 10 and baffle plate 14 is extremely rigid and resists bending forces to a much greater extent than a single circuit board. One of the difficulties relating to circuit boards of increased complexity is that larger boards, such as those over a foot in length, are difficult to support in a rack. In a typical mounting arrangement, circuit boards are mechanically supported at both ends, and one long edge may be plugged into a non-removable board referred to as a backplane or motherboard. The other long edge is not mechanically supported, and may be subject to bending forces. For some long boards, it may be necessary to use a vertical orientation to avoid gravitational bending forces on the boards. Large boards have in the past had to include stiffening bars, which interfere with air flow and restrict component placement. In the present invention, however, the combined structure of a circuit board and baffle plate is rigid enough to withstand lateral bending forces, from the weight of the structure or from other sources.

The baffle plate 14 has openings 20 aligned with the components 12, 12'. As shown in FIG. 1, the structure including the baffle plate 14 and circuit board 10 is placed next to an adjacent circuit board 22, which is shown without any mounted circuit modules. The spacing between the circuit board 10 and the baffle plate 14 is selected to provide sufficient clearance for the circuit modules 12, 12'. This spacing also has a strong effect on the efficiency of cooling. In general, for the same air flow, cooling improves as the baffle plate 14 is brought closer to the components 12. However, there must be sufficient space for spent air to exit around the other components. The best solution from a cooling standpoint is to provide a large space and to use tubes instead of openings to carry the impingement air to the components. Unfortunately, such an arrangement is too complex and costly for most practical systems. The spacing between the baffle plate 14 and the adjacent circuit board 22 is selected to provide an air flow just sufficient to cool the components on the board 10.

Incoming air enters the space between the adjacent circuit board 22 and the baffle plate, as indicated by the arrow 24 at the left of the structure as illustrated, and passes through the openings 20, to impinge directly on the circuit modules 12, 12'. After passing over the circuit modules, the air leaves in the same direction in which it entered, i.e. to the right, as indicated by the arrow 26. Ideally, as taught in prior impingement cooling techniques, the circuit modules 12, 12' are positioned to permit exit air flow that minimizes the passage of spent air that has already been heated, past other components mounted on the board. As illustrated, air is prevented from leaving the right-hand end of the inlet plenum between the adjacent circuit board 22 and the baffle plate 14, by an end plate 30. Similarly, air is prevented from the leaving to the left from the space between the circuit board 10 and the baffle plate 14, by another end plate 32. It will be understood that different flow directions may be used, and that the cooling system may be pressurized, i.e. have a blower upstream of the inlet arrow 24, or evacuated, with the blower located downstream of the arrow 26.

The use of the single baffle plate 14 to form in inlet air plenum with the adjacent circuit board 22 reduces the overall volume of the device while still providing a large-area air plenum for efficient cooling with small blower motors. As an added advantage, the mechanical structure is made extremely rigid by the combination of circuit board and baffle plate.

Preferably, the openings 20 should be countersunk at their upstream ends. This reduces air-flow noise, which can otherwise take the form of a shrill whistling sound.

Figure 2:
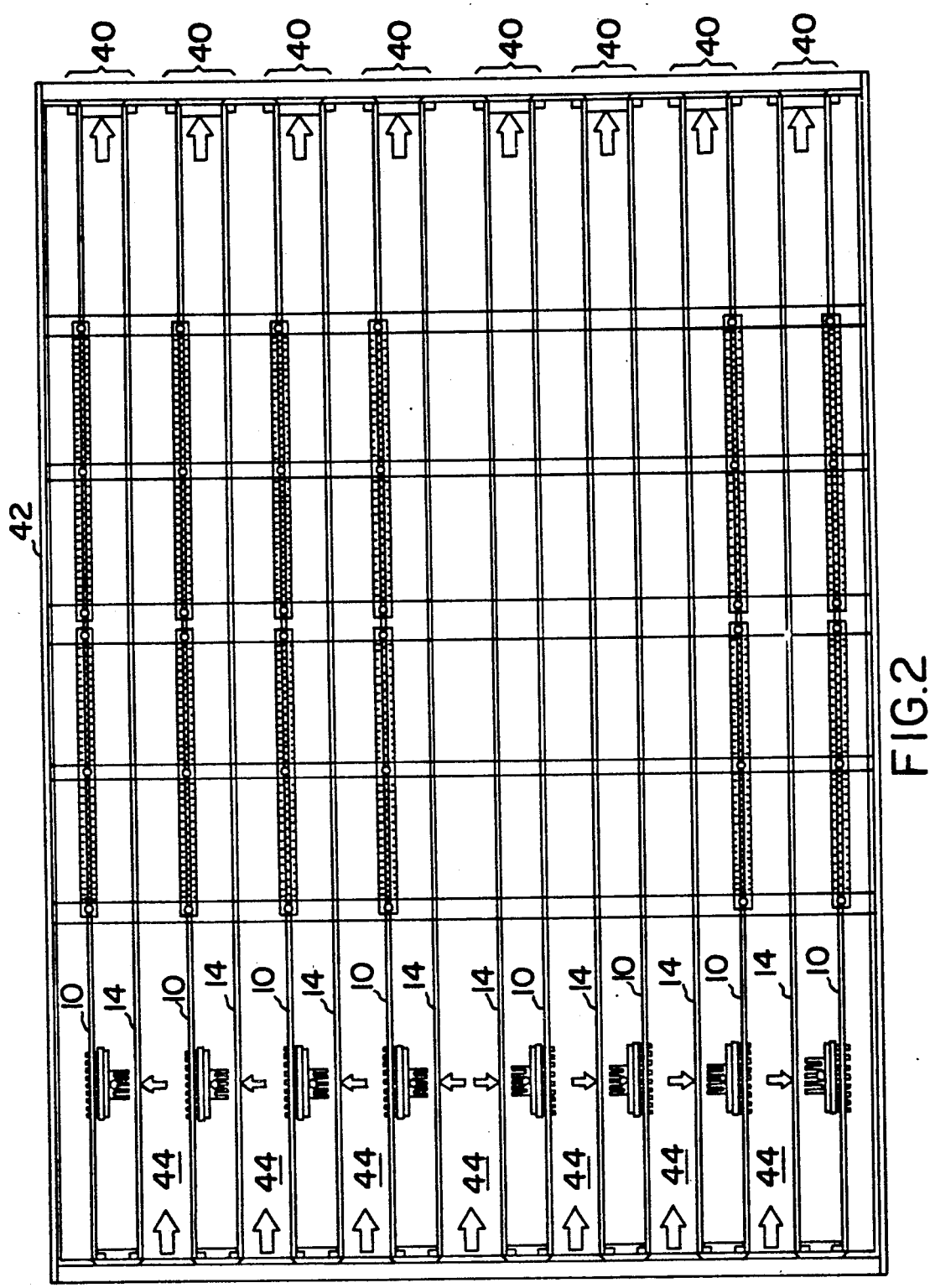
FIG. 2 is an elevational view of a plurality of circuit boards constructed in accordance with the invention and mounted in single rack.

FIG. 2 shows an assembly in which eight circuit board and baffle plate combinations 40 are mounted. Each combination 40 has a circuit board 10 and a baffle plate 14. Four of the board combinations 40 are mounted in one half of a circuit cage 42, with the circuit components facing in the same direction, downward as illustrated. The other four board combinations 40 are mounted in the other half of the cage 42, with their circuit modules facing in the opposite direction. Air inlet plena 44 are formed by the spaces between adjacent board combinations 40. Thus there are seven inlet air plena 44, the central one being slightly wider than the others, since it is used to feed air to both adjacent board combinations. As in FIG. 1, air is shown as entering from the left, into the air plena 44, and leaving to the right from the spaces between the boards 10 and the baffle plates 14.

The configuration shown in FIG. 2 is useful for two reasons, in addition to its cooling features. First, there is a significant space saving by having the component faces of the boards all facing the center of the cage 42. The boards on the outer edges of the cage do not then require a special inlet air plenum between the board and the outer walls of the cage. Second, the configuration facilitates testing the outer boards without their removal, since the outer walls of the cage 42 can be designed to have numerous openings for the insertion of test probes. Others of the circuit boards can be moved to these advantageous outer positions if they need to be tested while in operation.

The arrangement shown in FIGS. 1 and 2 is satisfactory for many applications, and provides some important advantages in addition to meeting its primary objectives of impingement cooling and increased board rigidity. First, the circuit modules are well protected by the baffle plate 14, and the combination board is rendered more rugged for shipping and installation. Moreover, the direct impingement air openings 20 are permanently aligned with the circuit modules that they are intended to cool. However, the circuit modules are difficult to service or test without removing the baffle plate 14, and other configurations may be more appropriate for some applications.

Figure 3:
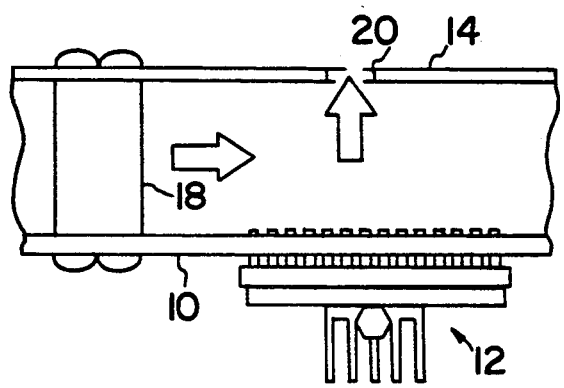
FIG. 3 is a fragmentary view of an alternative embodiment of the invention, in which a baffle plate is positioned next the face of a circuit board on which no components are mounted.

For example, as shown in FIG. 3, the baffle plate 14 may be installed on the opposite side of the circuit board 10, leaving the circuit modules 12 exposed for ease of access. In this arrangement, the circuit modules 12 have to be cooled by air flow from an adjacent baffle plate. An inlet air plenum is formed by the space between the circuit board 10 and the baffle plate 14. The openings 20 have to be aligned with the circuit modules on the next adjacent circuit board.

Figure 4:
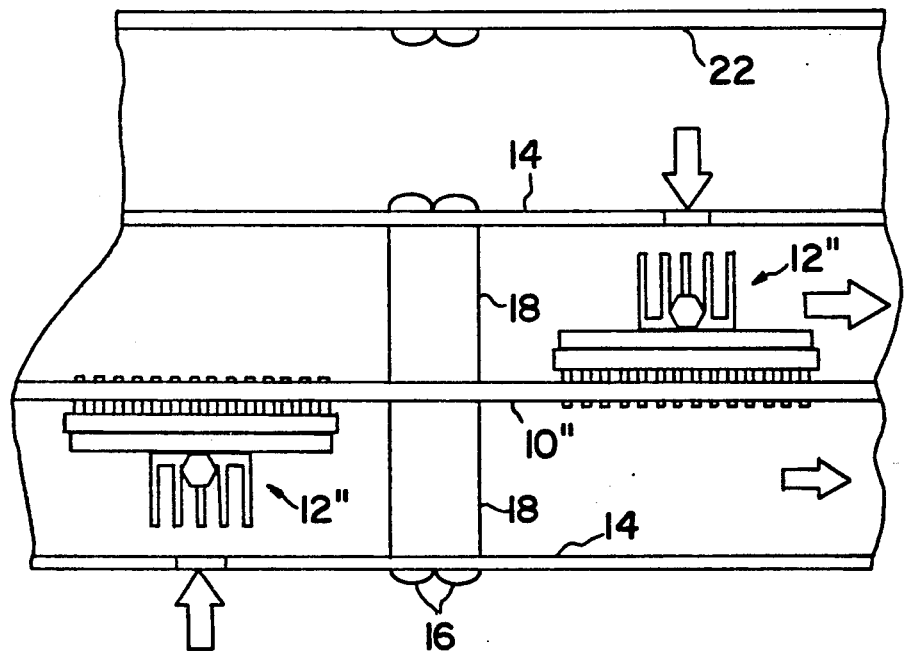
FIG. 4 is a fragmentary view of another alternative embodiment of the invention, in which two baffle plates are included in a unitary construction on opposite sides of a single circuit board having components on both sides.

Another possibility is the use of two baffle plates 14 to a single circuit board 10'', as shown in FIG. 4. The circuit board 10'' has circuit modules 12 mounted on both sides, and air is directed through openings in the baffle plates, into the spaces surrounding the board, then out through the opposite end as previously discussed.

It will be appreciated from the foregoing that the present invention represents a significant advance in the field of circuit board construction. In particular, the invention provides for impingement cooling of circuit modules mounted on circuit boards, without having to employ separate air plena. An important advantage of the structure of the invention is a large improvement in rigidity, which is especially important for large circuit boards. It will also be appreciated that, although a number of embodiments of the invention have been described in detail for purposes of illustration, various modifications may be made without departing from the spirit and scope of the invention. Accordingly, the invention is not to be limited except as by the appended claims.

I claim:

1. A circuit board construction in which multiple circuit boards function as faces of cooling air plena, the construction comprising:

a plurality of circuit boards on which circuit modules are mounted on at least one face of each board;

a plurality of baffle plates of approximately the same length and width as the circuit boards each having openings at selected locations;

means for rigidly connecting one or two of the baffle plates to one of the circuit boards in a parallel, spaced-apart relationship with the openings arranged to direct cooling air directly onto selected circuit modules, thereby forming a plurality of separable circuit-board units, each unit including one circuit board, connecting means and said one or two baffle plates; and a circuit board cage having an interior surface, said cage removably mounting the plurality of circuit board units in a parallel, spaced-apart relationship with said interior surface proximate said mounted circuit boards and said baffle plates, said circuit boards, baffle plates and cage arranged to form a plurality of cooling air plena, each cooling air plenum being defined in part by adjacent parallel faces of a baffle plate and a circuit board and said interior surface of said cage.

2. A circuit board construction as defined in claim 1, wherein:

each circuit-board unit includes one circuit board and one baffle plate;

the circuit modules on each of the circuit boards are located on an inner surface of the circuit board, facing the baffle plate to which the circuit board is connected; and air is directed into each circuit board unit, through the openings in the baffle plate and onto the circuit modules.

3. A circuit board construction as defined in claim 1, wherein:

at least one of the circuit-board units includes one circuit board and two baffle plates, the baffle plates being located on opposite sides of the circuit board;

circuit modules are located on both sides of the circuit board; and air is directed into the at least one circuit-board unit, through openings in both baffle plates and onto the circuit modules.

* * * * *